(12) United States Patent
Misawa

(10) Patent No.: US 7,566,860 B2
(45) Date of Patent: Jul. 28, 2009

(54) IMAGE PICKUP DEVICE WITH A FLEXIBILITY INCREASING SECTION

(75) Inventor: Takeshi Misawa, Saitama (JP)

(73) Assignee: Fujifilm Corporation, Minato-ku, Tokyo (JP)

( * ) Notice: Subject to any disclaimer, the term of this patent is extended or adjusted under 35 U.S.C. 154(b) by 305 days.

(21) Appl. No.: 11/529,213

(22) Filed: Sep. 29, 2006

(65) Prior Publication Data
US 2007/0075389 A1     Apr. 5, 2007

(30) Foreign Application Priority Data
Sep. 30, 2005    (JP)    ............. P2005-288860

(51) Int. Cl.
*H01L 31/00*    (2006.01)
(52) U.S. Cl. .................................. 250/214.1
(58) Field of Classification Search .............. 250/214.1
See application file for complete search history.

(56) References Cited

U.S. PATENT DOCUMENTS
6,670,599 B2 * 12/2003 Wagner et al. ........... 250/214.1

FOREIGN PATENT DOCUMENTS

| JP | 9-68752 | 3/1997 |
|----|---------|--------|
| JP | 9-98326 | 4/1997 |
| JP | 2000-115611 | 4/2000 |
| JP | 2000-184250 | 6/2000 |
| JP | 2003-234932 | 8/2003 |

* cited by examiner

*Primary Examiner*—Seung C Sohn
(74) *Attorney, Agent, or Firm*—McGinn IP Law Group, PLLC (57) ABSTRACT

An image pickup device comprises: a flexible substrate; a photosensitive layer formed above the flexible substrate and sandwiched between a pixel electrode layer and an opposite electrode layer; a signal reading section, formed on the flexible substrate, that reads a photoelectric charge generated as a result of incidence of light into the photosensitive layer; and a flexibility increasing section that splits the photosensitive layer between pixels in a predetermined position, the flexibility increasing section extending in a direction perpendicular to a surface of the flexible substrate.

15 Claims, 8 Drawing Sheets

IMAGE PICKUP DEVICE WITH A FLEXIBILITY INCREASING SECTION

BACKGROUND OF THE INVENTION

1. Field of the Invention

The present invention relates to an image pickup device which can be wound up.

2. Description of the Related Art

Digital cameras are spreading at a remarkable pace, and film cameras for taking a picture using a silver film are less frequently used. However, high-class single-lens reflex cameras which have widely spread are film cameras, and there is strong demand for the capability of utilizing high performance optical lens systems, AF function and AE function of such cameras.

Figure 7A:
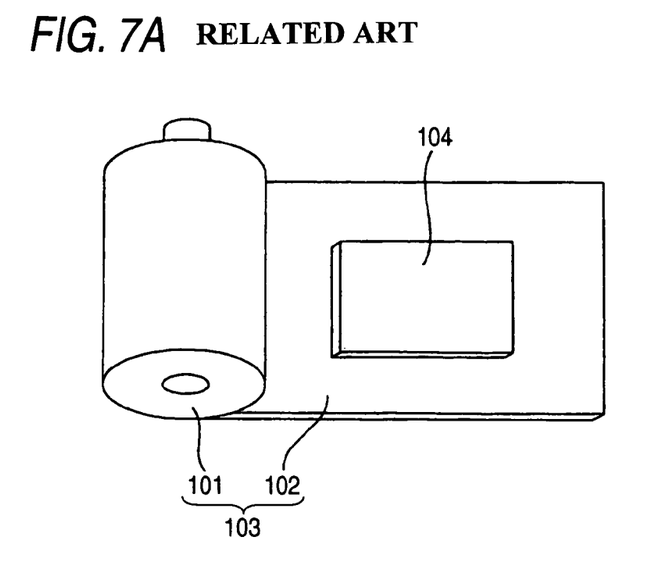
FIGS. 7A and 7B are illustrations of a film cartridge type digital camera according to the related art.

Under the circumstance, there are proposals of film cartridge type digital cameras as described in JP-A-2000-115611, JP-A-9-98326, JP-A-2000-184250, JP-A-2003-234932 and JP-A-9-68752. FIG. 7A is an external view of a cartridge type digital camera according to the related art. The camera includes a housing 103 configured by connecting a cartridge main body 101 identical in shape to a cartridge for containing a film and a plate portion 102 which simulates the shape of a film having a predetermined length pulled out from the main body 101. The camera is configured such that a CCD type or CMOS type image sensor (image pickup device) 104 fabricated on a semiconductor substrate can be mounted in the plate portion 102 and such that a processing unit for driving and controlling the image sensor 104 and processing picked-up image data can be contained along with a battery in the main body 101.

Figure 7B:
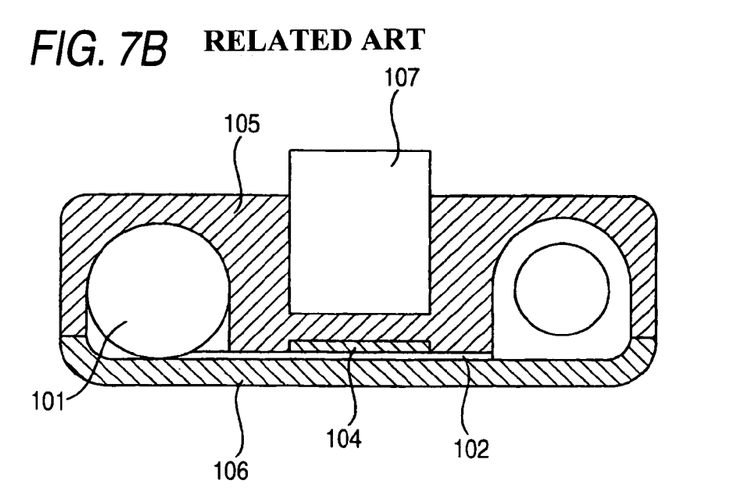

When such a film cartridge type digital camera is used, as shown in FIG. 7B, a rear cover 106 of a film camera 105 is opened, and the main body 101 is contained in a cartridge containing portion such that the image sensor 104 is located on an image forming plane of an optical lens system 107 of the film camera 105 to allow image of an object to be picked up.

The film cartridge type digital cameras according to the related art has a problem in that it can be mounted only in a film camera having a rear cover which can be opened. The reason is that the image sensor 104 is fixed in the state in which it outwardly protrudes from the cartridge main body 101 and that the camera is therefore not mountable in compact cameras or drop-in type film cameras such APS cameras.

Further, since a surface of the image sensor 104 of the film cartridge type digital camera according to the related art is exposed for a long time in a film camera, the surface may be made dirty or damaged by dust generated when a mechanical shutter is mechanically operated many times in the film camera. That is, it may become impossible to pick up a preferable image after use for a long time.

SUMMARY OF THE INVENTION

It is an object of the invention to provide an image pickup device which can be mounted even in the type of film cameras that allows a film to be mounted with a rear cover kept closed and which can pick up an image on a pickup surface that is kept clean.

According to the invention, there is provided an image pickup device comprising: a flexible substrate; a photosensitive layer formed above the flexible substrate and sandwiched between a pixel electrode layer and an opposite electrode layer; a signal reading section, formed on the flexible substrate, that reads a photoelectric charge generated as a result of incidence of light into the photosensitive layer; and a flexibility increasing section that extends in a direction perpendicular to a surface of the flexible substrate so as to split, in a direction substantially parallel to the surface of the flexible substrate, the photosensitive layer between pixels in a predetermined position.

According to the invention, there is provided the image pickup device, wherein the flexibility increasing section is a space.

According to the invention, there is provided the image pickup device, wherein the flexibility increasing section is an insulated buffer.

According to the invention, there is provided the image pickup device, wherein the insulated buffer is a high molecular compound.

According to the invention, there is provided the image pickup device, wherein the insulated buffer is an anisotropic conductor.

According to the invention, there is provided the image pickup device, wherein the flexibility increasing section has a deformation allowing capacity which increases toward a light entering side.

According to the invention, there is provided the image pickup device, comprising a plurality of sets of layers formed one over another, each set including: the photosensitive layer; and the pixel electrode layer and the opposite electrode layer sandwiching the photosensitive layer, wherein the photosensitive layer of each set has a peak of light-receiving sensitivity in a different wavelength range.

According to the invention, there is provided the image pickup device, comprising three sets of layers formed one over another, each set including: the photosensitive layer; and the pixel electrode layer and the opposite electrode layer sandwiching the photosensitive layer, wherein first one of the sets of layers has light-receiving sensitivity to red light; second one of the sets of layers has light receiving sensitivity to green light; and third one of the set of layers has light-receiving sensitivity to blue light.

According to the invention, there is provided the image pickup device, wherein the flexible substrate comprises a semiconductor layer, the signal reading section is formed on the semiconductor layer, the signal reading section comprises: an element having a charge transfer unit that transfers the photoelectric charge at a pixel in a predetermined position; or an element having a reading mechanism that selectively reads a signal corresponding to the photoelectric charge at the pixel in the predetermined position.

DETAILED DESCRIPTION OF THE INVENTION

An embodiment of the invention will now be described with reference to the drawings.

Figure 1:
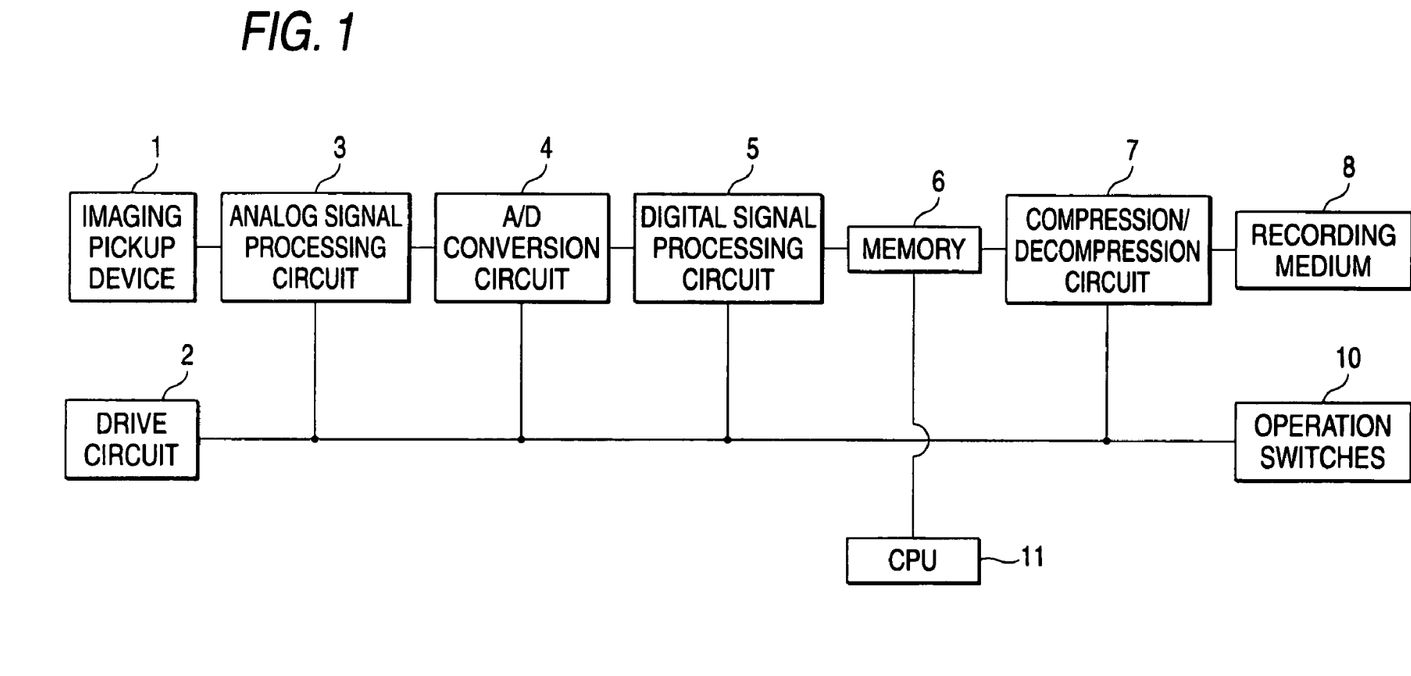
FIG. 1 is a functional block diagram of a digital camera utilizing an image pickup device according to an embodiment of the invention.

FIG. 1 is a configuration diagram of functional blocks of a digital camera loaded with an image pickup device according to the embodiment of the invention. The digital camera includes an image pickup device 1 fabricated such that it can be wound up, a drive circuit 2 for driving and controlling the image pickup device 1, an analog signal processing circuit 3 for performing analog processes such as a correlated double sampling process on an image signal output from the image pickup device 1, an A-D conversion circuit 4 for converting the resultant analog image signal into a digital signal, and a digital signal processing circuit 5 for performing digital processes such as a gain correction process, a gamma correction process, and an RGB-YC conversion process on the digital signal obtained by converting the image signal.

The digital camera of this embodiment further includes a memory 6 for temporarily accumulating picked-up image data output from the digital signal processing circuit 5, a compression/decompression circuit 7 for compressing the picked-up image data in the memory 6 into picked-up image data in the JPEG format and decompressing it into the initial state, a recording medium 8 for storing the compressed picked-up image data, an operation switch 10, and a CPU 11 for controlling the digital camera as a whole.

Figure 2:
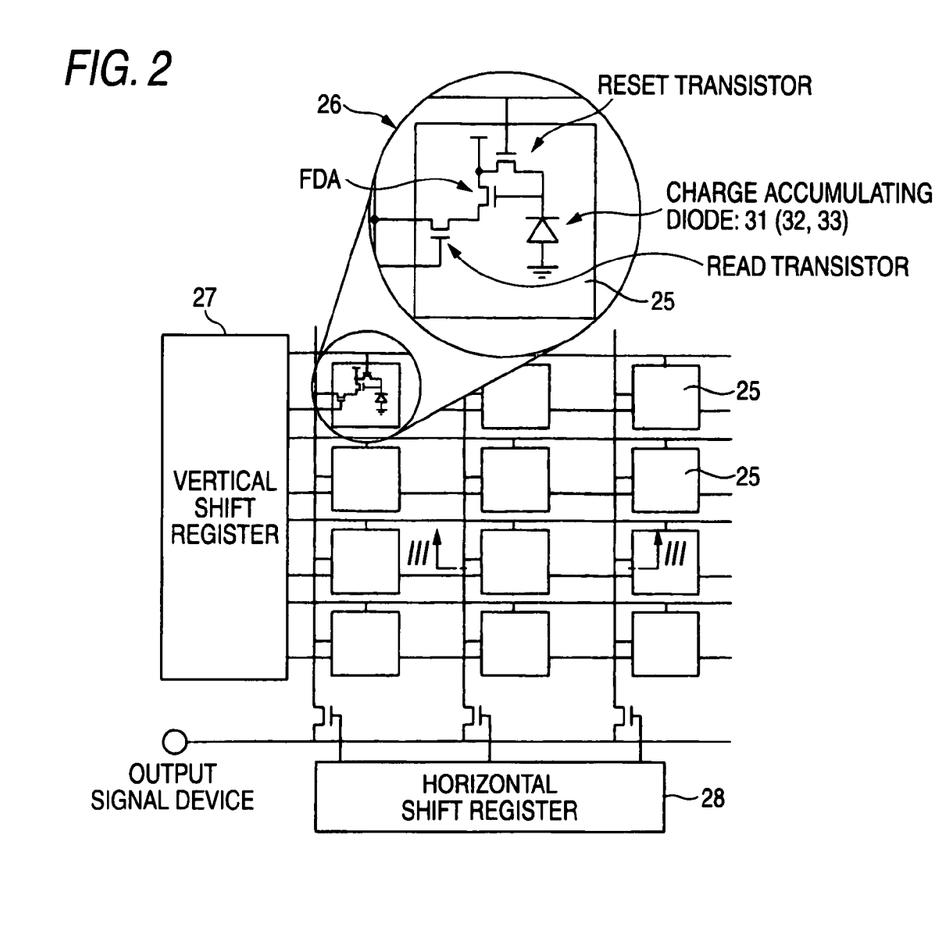
FIG. 2 is a schematic view of a part of a surface of the image pickup device shown in FIG. 1.

FIG. 2 is a schematic view of a part of a surface of the image pickup device 1 according to the present embodiment. A multiplicity of pixels 25 are formed on the surface of the image pickup device 1 in an arrangement which is in the form of a square grid in the illustrated example. Signal reading circuits 26 are formed at the bottom of each pixel 25 for reading image signals R, G, and B associated with R (red), G (green), and B (blue) signal charges detected at the pixel 35.

Although signal reading circuits constituted by three transistors as used in a CMOS type image sensor are illustrated as examples of the signal reading circuits 26 in the present embodiment, signal reading circuits constituted by four transistors may alternatively be used. Three signal reading circuits 26 are provided at each pixel, and the signal reading circuits read R, G, and B detection signals, respectively, and output them to the analog processing circuit 3 (FIG. 1) when specified by a vertical shift register 27 and a horizontal shift register 28.

Figure 3A:
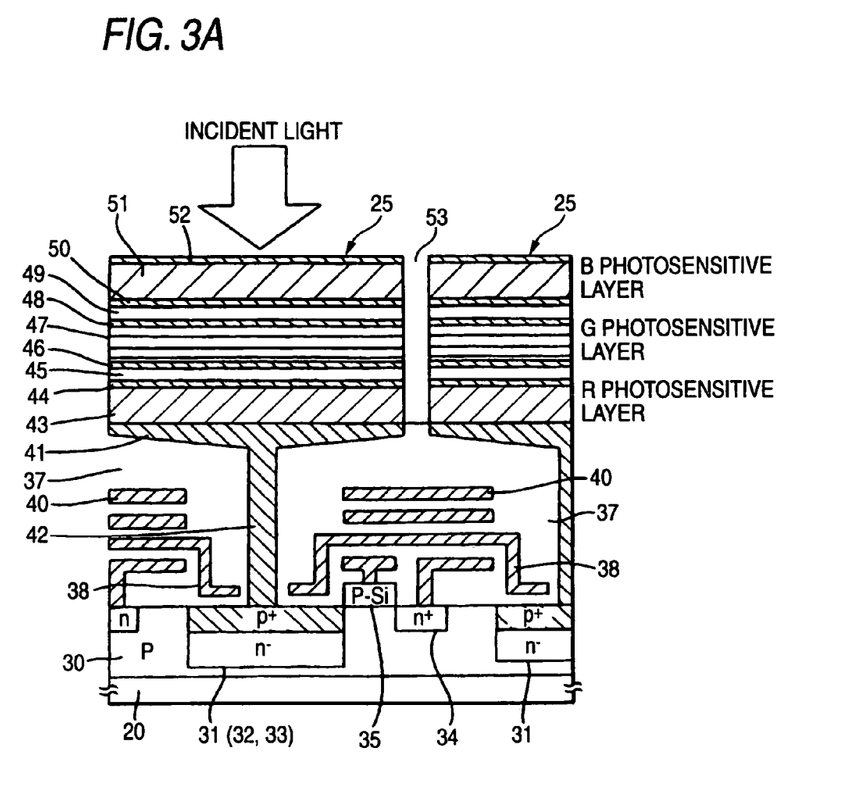
FIGS. 3A and 3B are schematic views of the section along the line III-III in FIG. 2.

FIG. 3A is a schematic view of the section in the position indicated by the line III-III in FIG. 2, the section substantially corresponding to one and half pixels. In the present embodiment, a p-type semiconductor layer 30 is formed on a flexible substrate 20 provided by forming a material such as polyethylene terephthalate (PET) into a sheet of film. Diode portions as described below and the signal reading circuits 26 are formed in the semiconductor layer 30 using, for example, a technique for manufacturing a TFT matrix on a semiconductor substrate as disclosed in JP-A-5-158070 and a technique for manufacturing an organic EL element.

First, a diode portion 31 to serve as a signal charge accumulating region for red (R) is formed in a predetermined position of the surface of the semiconductor layer 30. A diode portion 32 to serve as a signal charge accumulating region for green (G) is formed on the other side of the diode portion 31 away from the plane of the drawing. A diode portion 33 to serve as a signal charge accumulating region for blue (B) is formed further away from the plane of the drawing.

An n region 34 forming a part of the transistor of a signal reading circuit 26 is formed in a surface region of the semiconductor layer 30. When a read voltage is applied to a gate electrode 35 provided on the surface of the semiconductor layer 30 with a surface oxide film (omitted in the figure) interposed between them, a charge accumulated in the diode portion 31 moves to the n region 34 and read out from the image pickup device 1 by the signal reading circuit.

Referring to the signal reading circuits 26, each pixel is provided with an R signal reading circuit for reading the charge accumulated in the diode portion 31, a G signal reading circuit for reading a charge accumulated in the diode portion 32, and a B signal reading circuit for reading a charge accumulated in the diode portion 33. Those signal reading circuits 26 are shielded from light by a shield film 38 embedded in an insulation layer 37 formed on the surface of the semiconductor layer 30. A wiring 40 for connecting the signal reading circuits with the vertical shift register 27 and the horizontal shift register 28 shown in FIG. 2 is laid above the shield film 38 in the insulation layer 37.

An R pixel electrode layer 41 is formed on the surface of the insulation layer 37, and a vertical wiring 42 for connecting the R pixel electrode layer 41 and the diode portion 31 is erected. A photosensitive layer (photoelectric conversion layer) 43 sensitive to red light is formed on the R pixel electrode layer 41, and a transparent opposite electrode layer 44 is formed on the same.

A transparent insulation layer 45 is formed on the opposite electrode layer 44, and a transparent G pixel electrode layer 46 is formed on the same. A vertical wiring, which is not shown, for connecting the G pixel electrode layer 48 and the G diode portion 32 is erected (on the other side of the vertical wiring 42 away from the plane of the drawing: see reference number 42g shown in the pixel on the right side in FIG. 3B). A photosensitive layer (photoelectric conversion layer) 47 sensitive to green light is formed on the G pixel electrode layer 46, and a transparent opposite electrode layer 48 is formed on the same.

A transparent insulation layer 49 is formed on the opposite electrode layer 48, and a transparent B pixel electrode layer 50 is formed on the same. A vertical wiring, which is not shown, for connecting the B pixel electrode layer 50 and the B diode portion 33 is erected (on the other side of the vertical wiring 42 further away from the plane of the drawing) A photosensitive layer (photoelectric conversion layer) 51 sensitive to blue light is formed on the B pixel electrode layer 50, and a transparent opposite electrode layer 52 is formed on the same.

The vertical wiring 42 for red, the vertical wiring for green, and the vertical wiring for blue, connect the respective diode portions and pixel electrode layers, and they are electrically insulated from other members. A transparent protective film is formed on the opposite electrode layer 52 (not shown in FIG. 3).

Figure 3B:
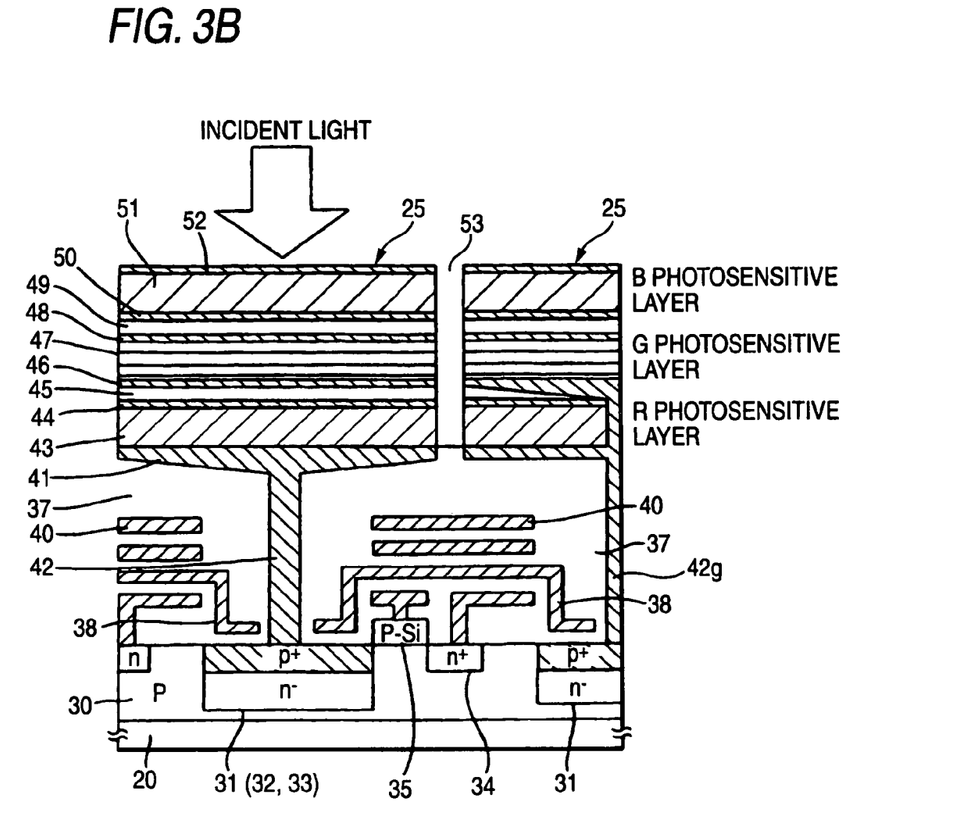
Figure 4:
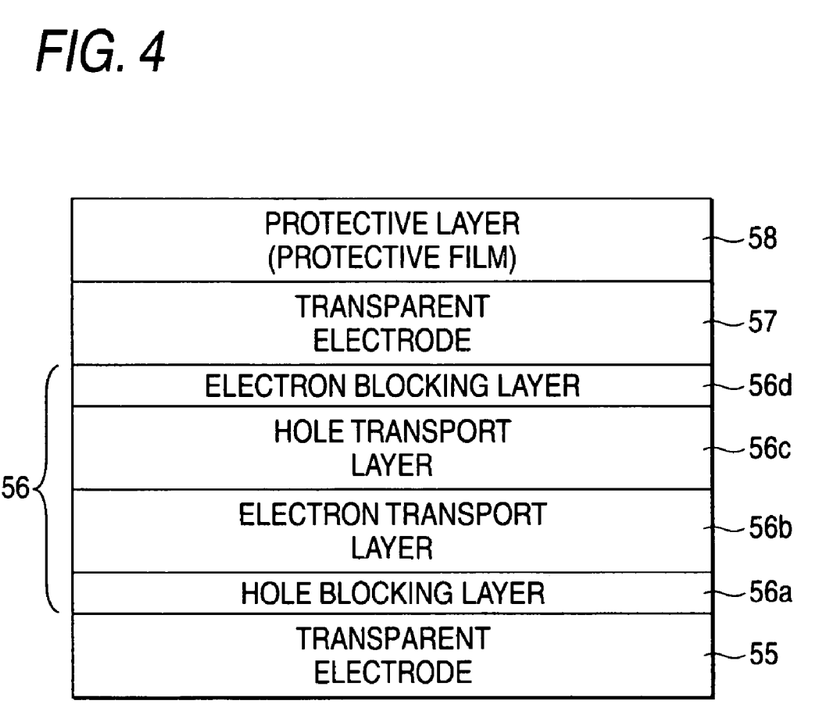
FIG. 4 is an illustration of an image pickup device having stacked type photosensitive layers (photoelectric conversion layers)

Although FIG. 3 illustrates a configuration in which the photosensitive layers are sandwiched by the respective transparent electrode layers (pixel electrode layers and opposite electrode layers), a layered structure as shown in FIG. 4 is more preferably employed. Specifically, a photosensitive layer 56 is formed on a transparent pixel electrode layer 55; a transparent opposite electrode layer 57 is formed on the layer 56; and a transparent protective layer 58 is formed on the layer 57 (whereas a protective layer is provided only on the uppermost opposite electrode layer 52 in the three-layer structure shown in FIG. 3).

In the illustrated example, the photosensitive layer 56 is constituted by a hole blocking layer 56a formed on the pixel electrode layer 55, a electron transport layer 56b formed on the layer 56a, a hole transport layer 56c formed on the layer 56b, and an electron blocking layer 56d formed on the layer 56c.

When light from an object enters such an image pickup device 1, rays in the wavelength range of blue included in the incident light are absorbed by the B photosensitive layer 51, and hole-electron pairs are generated according to the quantity of the absorbed rays. The electrons of the pairs flow from the B pixel electrode layer 50 through the vertical wiring into the B diode portion 33 to be accumulated therein.

Similarly, rays in the wavelength range of green included in the incident light are absorbed by the G photosensitive layer 47, and hole-electron pairs are generated according to the quantity of the absorbed rays. The electrons of the pairs flow from the G pixel electrode layer 46 through the vertical wiring into the G diode portion 32 to be accumulated therein.

Similarly, rays in the wavelength range of green included in the incident light are absorbed by the R photosensitive layer 43, and hole-electron pairs are generated according to the quantity of the absorbed rays. The electrons of the pairs flow from the R pixel electrode layer 41 through the vertical wiring 42 into the R diode portion 31 to be accumulated therein.

When a read voltage is applied to the gate electrode layer 35, the charges accumulated at the diode portions 31, 32, and 33 move to the n region 34. The charges are read from the image pickup device by the signal reading circuits 26 and output to the analog signal processing circuit 3 shown in FIG. 1.

The image pickup device 1 of the present embodiment can be wound up because it is formed on the flexible substrate 20 as described above. However, when it is wound up with a small radius of curvature, there is a great difference in curvature between the light receiving surface and the bottom surface of the flexible substrate 20, and the photosensitive layers and electrode layers are therefore subjected to a great stress.

In the present embodiment, a flexibility increasing section is provided to split the photosensitive layers sandwiched by the pixel electrode layers and the opposite electrode layers between pixels in appropriate positions, the splits extending in a direction perpendicular to the sheet surface of the flexible substrate 20. In the example shown in FIGS. 3A and 3B, pixels are separated from each other by a microscopic gap (space) 53 to provide a structure which allows a great deflection. Thus, the image pickup device 1 can be placed in a cartridge for containing a photographic film according to the related art by applying it to a sheet material like a photographic film in the related art and winding it up along with the film.

The components of the digital camera shown in FIG. 1 to be contained in a cartridge are the same as those of the film cartridge type digital camera according to the related art except that the image pickup device 1 is contained in addition, and the operation switches 10 including a power switch are provided on the housing of the cartridge.

Figure 5A:
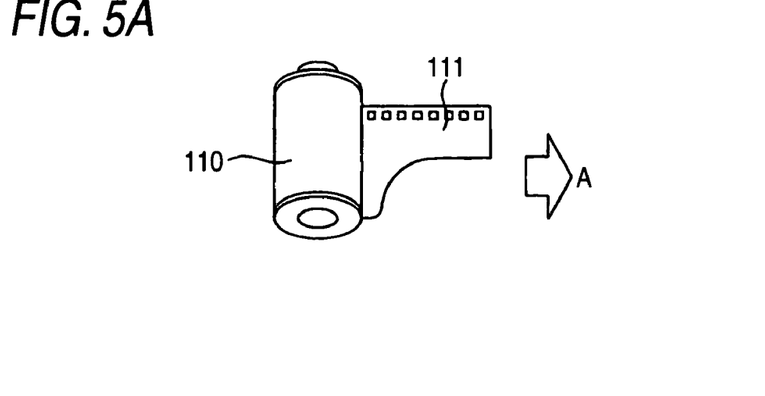
FIGS. 5A, 5B and 5C show an example of the use of the image pickup device shown in FIGS. 3A and 3B.
Figure 5B:
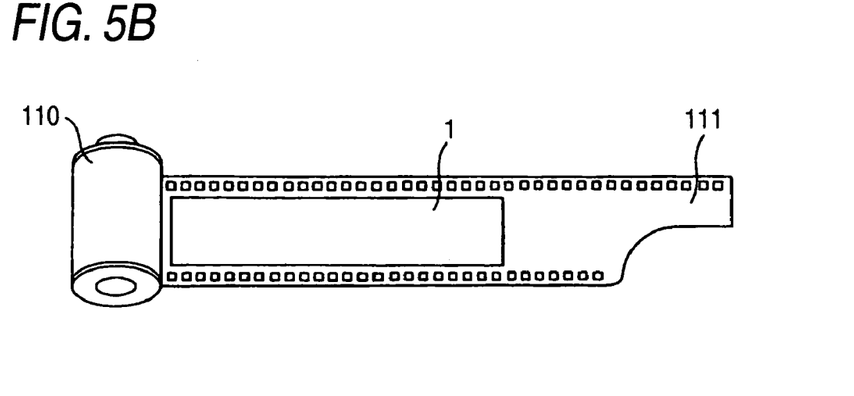
Figure 5C:
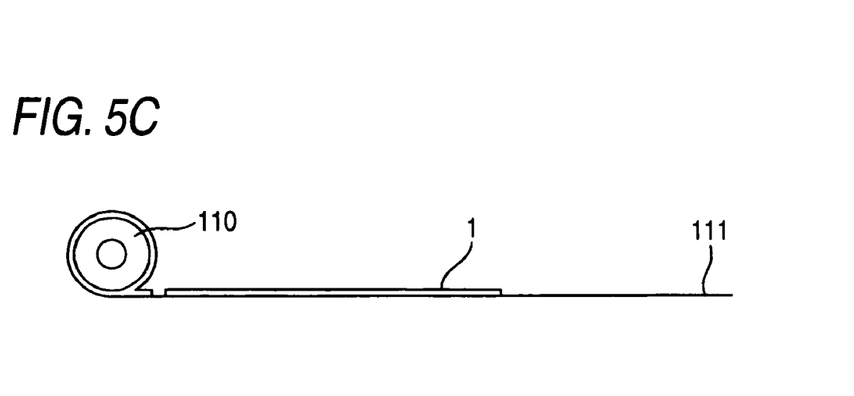

When a tongue-like part 111 of a photographic film is pulled out from a cartridge 110 in the direction of the arrow A as shown in FIG. 5A, an image pickup device 1 applied to the film is pulled out from the cartridge 110 as shown in FIGS. 5B and 5C.

In the example shown in FIGS. 5A, 5B, and 5C, an elongated image pickup device 1 having a predetermined length in the longitudinal direction of the film is applied to the film. The purpose is to provide adaptability to various types of film cameras because each film camera is different from others in the distance between the position of the image forming plane of the optical lens and a cartridge.

When an image pickup device 1 shorter than the entire length of a film is used, the automatic film take-up function of the film camera must be disabled such that the image pickup surface of the image pickup device 1 will not be dislocated from the image forming plane of the optical system of the film camera.

The above-described image pickup device 1 can be used not only in the type of film cameras that allows a film to be mounted by opening a rear cover but also in drop-in type film cameras.

Figure 6:
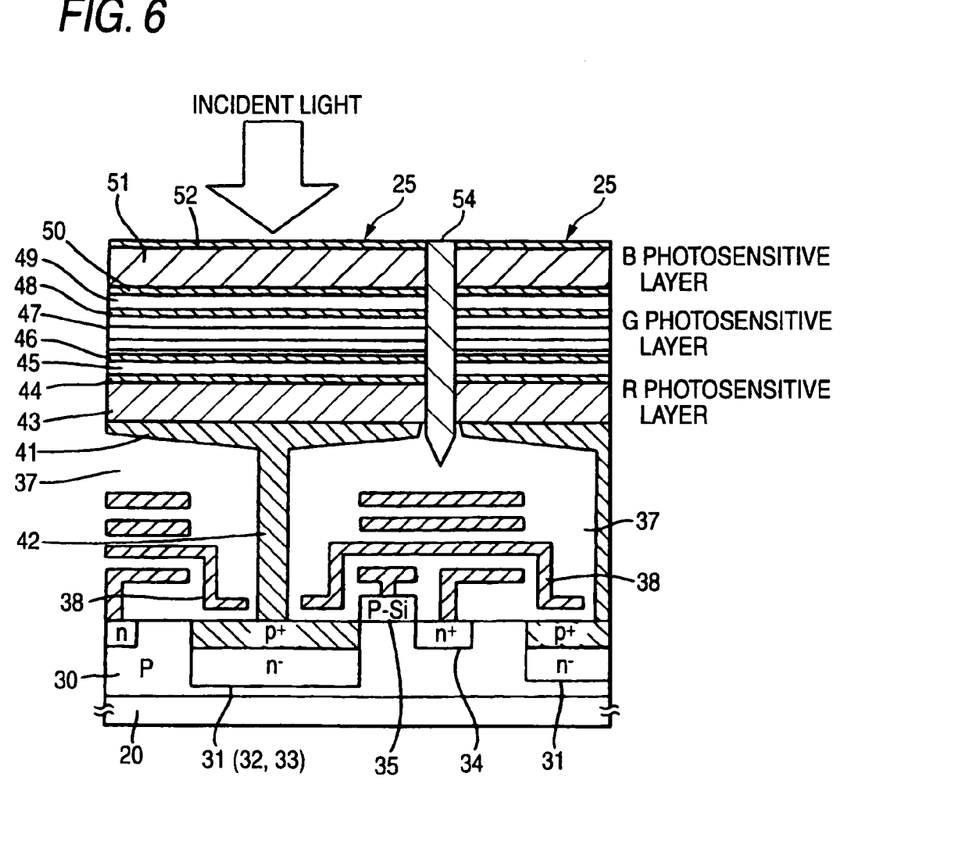
FIG. 6 is a schematic view of a section of an image pickup device according to another embodiment of the invention.

FIG. 6 is a schematic view of a section of an image pickup device according to another embodiment of the invention. The embodiment is different from the embodiment shown in FIGS. 3A and 3B only in that an insulated buffer 54 is inserted in the position of the gap 53 in FIGS. 3A and 3B. The insulated buffer 54 is formed from a high molecular compound or rubber. Alternatively, it may be formed from an anisotropic conductor which allows conduction in the horizontal direction and disallows conduction in the vertical direction. In this case, pixel electrode layers must be formed such that the peripheries of the pixel electrode layers will not come in contact with the anisotropic conductor to prevent the pixel electrode layers of adjoining pixels from conducting to each other.

In the embodiments shown in FIGS. 3A, 3B and 6, the gap 53 and the insulated buffer 54 are formed with a width which remains the same from the bottom (the side thereof closer to the flexible substrate 20) up to the top (the light entering side). It is preferable to form them with a width which increases toward the top because a greater deflection will be allowed.

While signal reading circuits constituted by transistors are provided in the semiconductor layer 30 in the above-described embodiments, a configuration may alternatively be employed, in which charges accumulated in the diode portions 31, 32, and 33 are read by forming registers constituting a vertical transfer channel and a horizontal transfer channel as in a CCD type image sensor.

Although each pixel is separated from another by a gap 53 or insulated buffer 54 in the above-described embodiments, an alternative configuration may obviously be employed, in which the flexibility increasing section such as the gap 53 and the insulated buffer 54 is provided in an appropriate position between a plurality of pixels to split a photosensitive layer.

The invention makes it possible to manufacture an image pickup device which is in the form of a film having high flexibility and which can therefore be wound up like a silver film according to the related art.

An image pickup device according to the invention can be deflected significantly, and it is therefore advantageously used in a digital camera which picks up an image using a film camera.

The entire disclosure of each and every foreign patent application from which the benefit of foreign priority has been claimed in the present application is incorporated herein by reference, as if fully set forth.

What is claimed is:

1. An image pickup device comprising:
   a flexible substrate;
   a photosensitive layer formed above the flexible substrate and sandwiched between a pixel electrode layer and an opposite electrode layer;
   a signal reading section, formed on the flexible substrate, that reads a photoelectric charge generated as a result of incidence of light into the photosensitive layer;
   a flexibility increasing section that extends in a direction perpendicular to a surface of the flexible substrate so as to split, in a direction substantially parallel to the surface of the flexible substrate, the photosensitive layer between pixels in a predetermined position; and a plurality of sets of layers formed one over another, each set including:

the photosensitive layer; and the pixel electrode layer and the opposite electrode layer sandwiching the photosensitive layer, wherein a peak wavelength of the photosensitive layers of the respective sets in light-receiving sensitivity are different from each other.

2. An image pickup device according to claim 1, wherein the flexibility increasing section comprises a space.

3. An image pickup device according to claim 1, wherein the flexibility increasing section comprises an insulated buffer.

4. An image pickup device according to claim 3, wherein the insulated buffer comprises a high molecular compound.

5. An image pickup device according to claim 3, wherein the insulated buffer comprises an anisotropic conductor.

6. An image pickup device according to claim 1, wherein the flexibility increasing section has a deformation allowing capacity which increases toward a light entering side.

7. An image pickup device according to claim 1, comprising three sets of layers formed one over another, each set including: the photosensitive layer; and the pixel electrode layer and the opposite electrode layer sandwiching the photosensitive layer, wherein first one of the sets of layers has light-receiving sensitivity to red light; second one of the sets of layers has light receiving sensitivity to green light; and third one of the set of layers has light-receiving sensitivity to blue light.

8. An image pickup device according to claim 1, wherein the flexible substrate comprises a semiconductor layer, the signal reading section is formed on the semiconductor layer, the signal reading section comprises: an element having a charge transfer unit that transfers the photoelectric charge at a pixel in a predetermined position; or an element having a reading mechanism that selectively reads a signal corresponding to the photoelectric charge at the pixel in the predetermined position.

9. The image pickup device according to claim 1, wherein the photosensitive layer comprises a blue photosensitive layer, a green photosensitive layer, and a red photosensitive layer.

10. The image pickup device according to claim 9, wherein the blue photosensitive layer, the green photosensitive layer, and the red photosensitive layer are separated by a transparent insulation layer.

11. The image pickup device according to claim 9, wherein the blue photosensitive layer, the green photosensitive layer, and the red photosensitive layer are each sandwiched between a transparent pixel electrode layer and a transparent opposite electrode layer.

12. The image pickup device according to claim 1, wherein the photosensitive layer further comprises:

a hole blocking layer;

an electron transport layer formed above the hole blocking layer;

a hole transport layer formed above the electron transport layer; and an electron blocking layer formed above the hole transport layer.

13. The image pickup device according to claim 1, further comprising a semiconductor layer between the photosensitive layer and the flexible substrate.

14. The image pickup device according to claim 13, wherein the semiconductor layer comprises:

a p-type semiconductor layer;

an n-region connected to the p-type semiconductor layer;

a diode portion connected to the p-type semiconductor layer; and a gate electrode on a surface of the p-type semiconductor layer.

15. An image pickup device, comprising:

a substrate;

a photosensitive layer formed between a pixel electrode layer and an opposite electrode layer, wherein the photosensitive layer, the pixel electrode layer, and the opposite electrode layer are formed above the substrate; and a flexible increasing section, wherein the flexible increasing section is adapted to split the photosensitive layer, the pixel electrode layer, and the opposite electrode layer in a direction perpendicular to a sheet surface of the substrate.

\* \* \* \* \*